US012787565B2

(12) United States Patent
Guo

(10) Patent No.: US 12,787,565 B2
(45) Date of Patent: Nov. 3, 2026

(54) DISPLAY PANEL AND PREPARATION METHOD THEREFOR, AND ELECTRONIC DEVICE

(71) Applicant: GUANGDONG OPPO MOBILE TELECOMMUNICATIONS CORP., LTD., Dongguan (CN)

(72) Inventor: Tianfu Guo, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 449 days.

(21) Appl. No.: 18/383,707

(22) Filed: Oct. 25, 2023

(65) Prior Publication Data

US 2024/0074250 A1 Feb. 29, 2024

Related U.S. Application Data

(63) Continuation of application No. PCT/CN2022/080957, filed on Mar. 15, 2022.

(30) Foreign Application Priority Data

Apr. 29, 2021 (CN) ......................... 202110473841.4

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/131* (2023.02); *H10K 59/873* (2023.02); *H10K 2102/311* (2023.02)

(58) Field of Classification Search
CPC ............. H10K 59/124; H10K 59/1201; H10K 59/131; H10K 59/873; H10K 2102/311
See application file for complete search history.

(56) References Cited

U.S. PATENT DOCUMENTS

| | | | | |
|---|---|---|---|---|
| 2018/0130966 | A1 | 5/2018 | Yun et al. | |
| 2018/0188564 | A1 | 7/2018 | Jiang et al. | |
| 2022/0085305 | A1 * | 3/2022 | Zhao | H10K 77/111 |

FOREIGN PATENT DOCUMENTS

| | | | |
|---|---|---|---|
| CN | 108231800 | A | 6/2018 |
| CN | 108649063 | A | 10/2018 |

(Continued)

OTHER PUBLICATIONS

CNIPA, Third Office Action for CN Application No. 202110473841.4, Jan. 31, 2024.

(Continued)

*Primary Examiner* — Samuel A Gebremariam
(74) *Attorney, Agent, or Firm* — Sheppard, Mullin, Richter & Hampton LLP

(57) ABSTRACT

Provided are a display panel and a preparation method therefor, and an electronic device. The display panel includes a base plate, an interlayer insulating layer, and a wiring. The base plate is provided with a first groove located in a non-display area. The interlayer insulating layer is provided on the base plate and covers the first groove, and the interlayer insulating layer is provided with a second groove at a position corresponding to the first groove. The wiring is provided on a part of the interlayer insulating layer in the non-display area and fills the second groove.

20 Claims, 7 Drawing Sheets

(51) Int. Cl.

| | |
|---|---|
| ***H10K 59/131*** | (2023.01) |
| ***H10K 59/80*** | (2023.01) |
| *H10K 102/00* | (2023.01) |

(56) References Cited

FOREIGN PATENT DOCUMENTS

| | | | |
|---|---|---|---|
| CN | 108922911 | A | 11/2018 |
| CN | 109037279 | A | 12/2018 |
| CN | 109860203 | A | 6/2019 |
| CN | 109860411 | A | 6/2019 |
| CN | 109994534 | A | 7/2019 |
| CN | 110085740 | A | 8/2019 |
| CN | 110504386 | A | 11/2019 |
| CN | 110556407 | A | 12/2019 |
| CN | 110610968 | A | 12/2019 |
| CN | 110797377 | A | 2/2020 |
| CN | 111276630 | A | 6/2020 |
| CN | 112071883 | A | 12/2020 |
| CN | 108417608 | B | 3/2021 |
| CN | 113193026 | A | 7/2021 |
| CN | 113206136 | A | 8/2021 |
| WO | 2020063128 | A1 | 4/2020 |

OTHER PUBLICATIONS

CNIPA, Office Action issued for CN Application No. 202110473841.4, Apr. 1, 2024.

EPO, Search Report for EP Application No. 22794375.0, Dec. 18, 2024.

WIPO, International Search Report for PCT Application No. PCT/CN2022/080957, May 19, 2022.

CNIPA, First Office Action for CN Application No. 202110473841.4, Apr. 26, 2022.

CNIPA, Second Office Action for CN Application No. 202110473841.4, Dec. 28, 2022.

CNIPA, Desicion of Rejection for CN Application No. 202110473841.4, Jun. 9, 2023.

CNIPA, Reexamination Decision for CN Application No. 202110473841.4, Sep. 26, 2023.

* cited by examiner

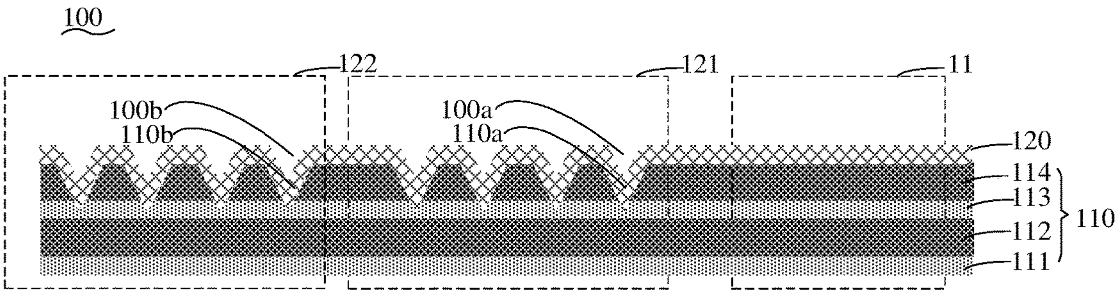

FIG. 16

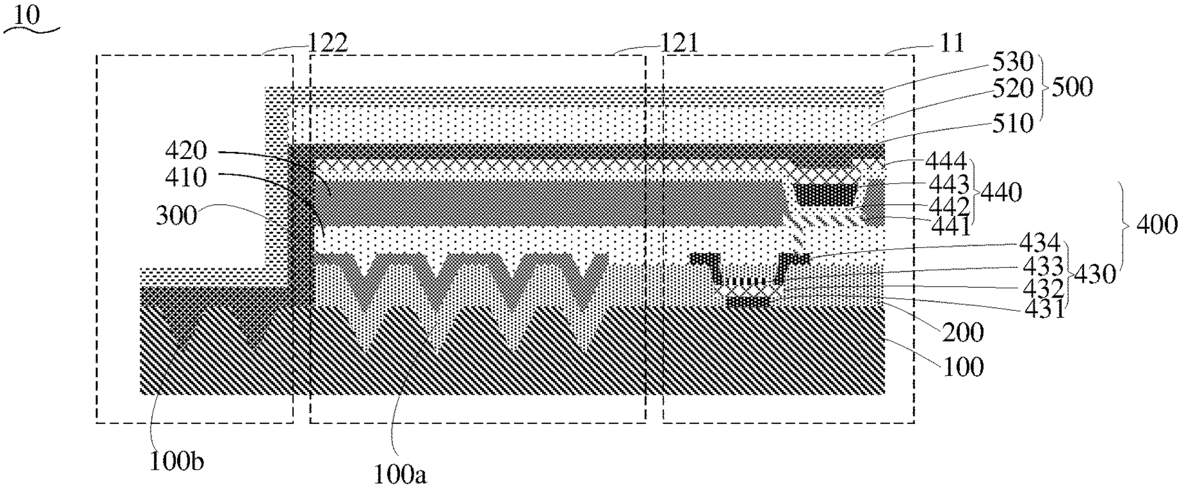

FIG. 17

Provide a base plate, and provide multiple first grooves in the non-display area of the base plate — 102

↓

Form an interlayer insulating layer on the base plate, in such a manner that the interlayer insulating layer covers the first grooves and multiple second grooves at positions corresponding to the first grooves are obtained — 104

↓

Form a wiring on a part of the interlayer insulating layer located in the non-display area, the wiring fills the second grooves — 106

FIG. 18

DISPLAY PANEL AND PREPARATION METHOD THEREFOR, AND ELECTRONIC DEVICE

CROSS-REFERENCE OF RELATED APPLICATIONS

The present disclosure is a continuation of International Application No. PCT/CN2022/080957 filed Mar. 15, 2022, which claims priority to Chinese Patent Application No. 202110473841.4 filed Apr. 29, 2021. The above-mentioned applications are hereby incorporated by reference in their entireties.

TECHNICAL FIELD

The present disclosure relates to the field of display technologies, and in particular to a display panel and a preparation method therefor, and an electronic device.

BACKGROUND

The statements herein merely provide background information related to the present disclosure, and do not necessarily constitute exemplary techniques.

With the development of the display technology, users have higher and higher requirements for the screen-to-body ratio of a display screen, where the higher the screen-to-body ratio, the better the display effect. The screen-to-body ratio of the display screen is defined as a ratio of the size of the display area to the size of the area enclosed by the frame in the display screen. Therefore, how to effectively reduce the size of the area occupied by the frame of the display screen is a key point to improve the screen-to-body ratio.

SUMMARY

Embodiments of the present disclosure provide a display panel and a preparation method therefor, and an electronic device.

In order to achieve the purpose of the present disclosure, the present disclosure adopts the following technical solutions.

A display panel is provided, the display panel includes a display area and a non-display area, and the display panel includes:

- a base plate, where the base plate is provided with a first groove, and the first groove is located in the non-display area;
- an interlayer insulating layer, where the interlayer insulating layer is provided on the base plate and covers the first groove, and the interlayer insulating layer is provided with a second groove at a position corresponding to the first groove; and
- a wiring, where the wiring is provided on a part of the interlayer insulating layer located in the non-display area, and fills the second groove.

A preparation method for a display panel is provided, where the display panel includes a display area and a non-display area, and the method includes:

- providing a base plate, and providing a first groove in the non-display area on the base plate;
- forming an interlayer insulating layer on the base plate in such a manner that the interlayer insulating layer covers the first groove and a second groove located a position corresponding to the first groove is obtained in the interlayer insulating layer; and forming a wiring on a part of the interlayer insulating layer located in the non-display area, where the wiring fills the second groove.

An electronic device is provided, which includes the display panel having a display area and a non-display area, where the display panel includes:

- a base plate, where the base plate is provided with at least one first groove, and the at least one first groove is located in the non-display area;
- an interlayer insulating layer, wherein the interlayer insulating layer is provided on the base plate and covers the at least one first groove, and the interlayer insulating layer is provided with at least one second groove at a position corresponding to the at least one first groove; and
- a wiring, where the wiring is provided on a part of the interlayer insulating layer located in the non-display area, and fills the at least one second groove.

The details of one or more embodiments of the present application are set forth in the following drawings and descriptions. Other features, objectives and advantages of the present application will be apparent from the description, drawings, and claims.

Other features and aspects of the disclosed features will become apparent from the following detailed description, taken in conjunction with the accompanying drawings, which illustrate, by way of example, the features in accordance with embodiments of the disclosure. The summary is not intended to limit the scope of any embodiments described herein.

BRIEF DESCRIPTION OF THE DRAWINGS

In order to more clearly explain technical solutions of the embodiments of the present disclosure, drawings used in the embodiments will be briefly introduced below. Obviously, the drawings as described below are merely some embodiments of the present disclosure. Based on these drawings, other drawings can be obtained by those skilled in the art without inventive effort.

FIG. 16 is a schematic structural diagram of a base plate illustrated in the embodiment of FIG. 13.

FIG. 17 is a schematic cross-sectional view of the display panel illustrated in the embodiment of FIG. 13 taken along line A-A.

FIG. 18 is a flowchart of a preparation method for a display panel according an embodiment.

DETAILED DESCRIPTION OF PREFERRED EMBODIMENTS

For ease of understanding of the present disclosure, the present disclosure will be comprehensively described with reference to the accompanying drawings. Preferred embodiments of the present disclosure are presented in the accompanying drawings. However, the present disclosure may be implemented in many different forms and is not limited to the embodiments described herein. Rather, the purpose of providing these embodiments is to enable thorough and comprehensive understanding of the contents of the present disclosure.

It will be understood that the terms "first", "second", and the like used in the present disclosure may be used herein to describe various elements, but these elements are not limited by these terms. These terms are only used to distinguish a first element from another element, and cannot be understood as indicating or implying relative importance or implicitly indicating the number of technical features indicated. Thus, a feature defined by "first", "second" may explicitly or implicitly indicate that at least one such feature is included. In the description of the present disclosure, "a plurality of" means at least two, for example, two, three, or the like, unless otherwise specified specifically.

Unless otherwise defined, all technical and scientific terms used herein have the same meaning as commonly understood by those skilled in the art of the present disclosure. The terminology used herein in the specification of the present disclosure is for the purpose of describing specific embodiments only and is not intended to limit the present disclosure.

Figure 1:
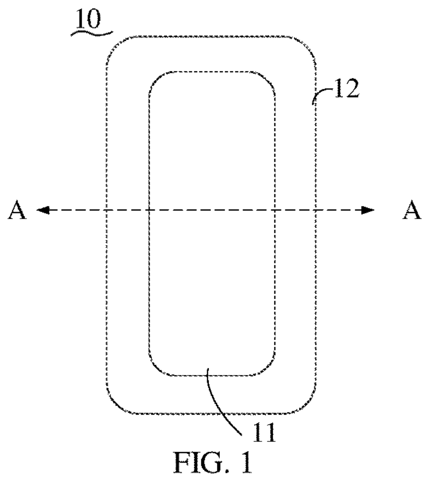
FIG. 1 is a schematic structural diagram of a display panel according to an embodiment.

Referring to FIG. 1, FIG. 1 is a schematic structural diagram of a display panel according to an embodiment.

Figure 2:
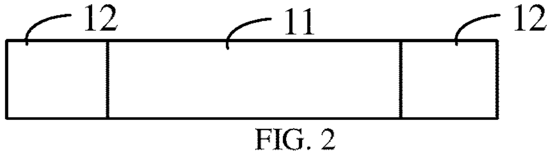
FIG. 2 is a schematic cross-sectional view of the display panel of the embodiment of FIG. 1 taken along line A-A.

In the embodiment, the display panel 10 is configured to implement a display function of the electronic device, and the electronic device may be a mobile phone, a tablet computer, a notebook computer, a personal digital assistant, a television, a multimedia display panel, or the like. Specifically, FIG. 1 is a schematic structural diagram of a display panel according to an embodiment, and FIG. 2 is a schematic cross-sectional view of the display panel of the embodiment of FIG. 1 along line A-A. As illustrated in FIG. 1 and FIG. 2, the display panel 10 may be divided into a display area 11 and a non-display area 12, and the non-display area 12 is provided around an edge of the display area 11. The display area 11 is configured to implement the display function, and the non-display area 12 is configured for provision of wirings, circuit structures and other laminated structures.

Figure 3:
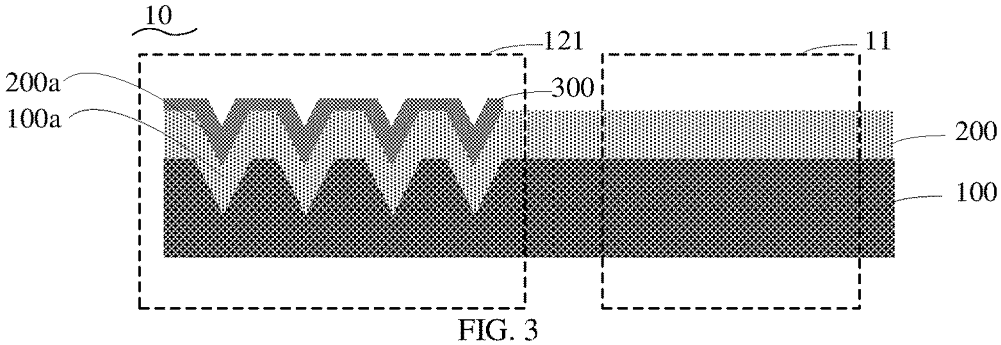
FIG. 3 is a schematic cross-sectional view of a display panel taken along line A-A according to an embodiment.

FIG. 3 is a schematic structural diagram of a display panel according to an embodiment. The display panel 10 includes a base plate 100, an interlayer insulating layer 200, and a wiring 300.

In the embodiment, the base plate 100 may be configured to provide a first groove therein, and support the interlayer insulating layer 200, the wiring 300 and other laminated structures (not illustrated). The overall thickness of the base plate 100 may be 15 μm to 50 μm, so that there is a large space for providing a groove in the base plate, and a deep groove may be obtained. The process of providing a groove in the base plate 100 is simple, which is beneficial to improving the yield.

The base plate 100 is provided with a plurality of first grooves **100*a*, and the plurality of first grooves 100*a* are located in the non-display area 12. The first grooves 100*a* are configured to receive the interlayer insulating layer 200 at respective positions, so that second grooves 200*a* are provided at positions corresponding to the first grooves 100*a*. The second grooves 200*a* have the same concave forms as the first grooves 100*a*, so that the second grooves 200*a* have the same shape and size as the first grooves 100*a*. By means of the provision of the first grooves 100*a*, the area of the exposed portion of the base plate 100 in the non-display area 12 may be increased, which increases the effective contact area between the interlayer insulating layer 200 and the base plate 100; in addition, the plurality of the second grooves 200*a* having the same concave forms as the first grooves 100*a* are obtained for the filling of the wiring 300, which increases the effective contact area between the wiring 300 and the interlayer insulating layer 200, and reduces the occupied area in the horizontal plane of the non-display area 12 that is occupied by the wiring 300, so that the non-display area 12 can be narrowed. In some embodiments, the number of the first grooves 100*a* is not less than 2, so that the effective contact area between the interlayer insulating layer 200 and the base plate 100** may be greatly increased.

In some embodiments, the base plate 100 is provided with a plurality of wiring areas 121. The first grooves **100*a* are located in at least one wiring area 121, so that the first grooves 100*a* enable the area of the exposed portion of the at least one wiring area 121 on the base plate 100 to be increased, which increases the effective contact area between the interlayer insulation layer 200 and the base plate 100. When the first grooves 100*a* are located in the plurality of wiring areas 121, the first grooves 100*a* enable the area of the exposed portions of the plurality of wiring areas 121 on the base plate 100 to be increased, thereby further increasing the effective contact area between the interlayer insulation layer 200 and the base plate 100**.

In some embodiments, there are a plurality of first grooves **100*a*. In each wiring area 121, at least two first grooves 100*a* are arranged along a first direction and/or at least two first grooves 100*a* are arranged along a second direction. The first direction and the second direction intersect with each other, and an included angle between the first direction and the second direction is greater than 0 degree and less than 180 degrees. The first direction and the second direction are not limited, and the first direction and the second direction may be adjusted according to actual requirements of the wiring 300** or processing conditions.

When at least two first grooves **100*a* are arranged along the first direction or at least two first grooves 100*a* are arranged along the second direction, the plurality of first grooves 100***a* define a plurality of groove structures interruptedly distributed in the same arrangement direction, so as to achieve the purpose of narrowing the wiring area 121. The provision of the plurality of groove structures in the same direction may simplify the processing steps, which is beneficial to large-scale production of the product.

When at least two first grooves 100*a* are arranged along the first direction and at least two first grooves 100*a* are arranged along the second direction, the plurality of first grooves 100*a* define, along each of multiple arrangement directions, a plurality of groove structures interruptedly distributed. This can improve the distribution density of the first grooves 100*a*, and improve the bonding strength between the interlayer insulating layer 200 and the base plate 100 as well as the bonding strength between the wiring 300 and the interlayer insulating layer 200. Further, the plurality of first grooves 100*a* are arranged in an array along each of the first direction and the second direction, and thus a plurality of groove structures are defined by arranging the plurality of first grooves 100*a* in an array along each of the multiple directions, this further improves the distribution density of the groove structures. It may be understood that, in an area where the array is arranged, every two adjacent first grooves 100*a* may be arranged side-by-side and aligned, or may be arranged to be staggered with each other, depending on the cross-sectional shape and the distribution density of the first grooves 100*a*.

In some embodiments, the non-display area 12 includes a first area 12A and a second area 12B that ate provided on two opposite sides of the display area 11. The non-display area 12 further includes a third area 12C connecting the first area 12A with the second area 12B. The first direction is perpendicular to an alternating direction along which the first area 12A, the display area 11, and the second area 12B take place by turn. In each of the wiring areas 121 of the first area 12A and the second area 12B, the at least one first groove 100*a* extends along the first direction. In the wiring area of the third area 12C, the at least one first groove extends along the alternating direction. The first groove(s) 100*a* extending along the first direction in each of the first area 12A and the second area 12B may greatly increase the area of the exposed portion in the extending direction, and may effectively reduce the area occupied by the first groove(s) 100*a* in the alternating direction, thereby further effectively improving the screen-to-body ratio. The first groove(s) 100*a* extending along the alternating direction in the third area 12C may greatly increase the area of the exposed portion in the extending direction, and effectively reduce the area occupied by the first groove(s) 100*a* in the first direction, thereby effectively improving the screen-to-body ratio. When the arrangement direction of the plurality of first grooves 100*a* is the same as the extension direction of the first grooves 100*a*, the number of the first grooves arranged along the arrangement direction is further reduced, thereby further simplifying the processing, and facilitating the large scale production of the product.

In some embodiments, the plurality of wiring areas 121 surround the edge of the display area 11, and each wiring area 121 is provided with at least one first groove 100*a*; in this way, it is ensured that the wiring area 121 located at each edge side of the display area 11 may be reduced. It may be understood that, the plurality of wiring areas 121 may surround the three edge sides of the display area 11, for example, they surround the upper edge side, the left edge side and the right edge side of the display area 11, or may surround the four edge sides of the display area 11, where the specific surrounding mode may be set based on the actual distribution area of the wiring 300.

In some embodiments, the plurality of wiring areas 121 are symmetrically distributed with respect to an axis of symmetry, and the first grooves 100*a* are symmetrically arranged with respect to the axis of symmetry or the plurality of first grooves 100*a* are symmetrically distributed with respect to the axis of symmetry, so that the size of the non-display area 12 may be reduced symmetrically, and the display effect of the display screen is improved.

In some embodiments, the first groove 100*a* is a strip-type groove, an annular groove, or a hole-type groove. Each of the strip-type groove and the annular groove has high continuity in extension along the length direction thereof, which enables high area utilization in the extension direction, and facilitates the provision of a deep groove. The hole-type groove has low continuity in extension along the length direction thereof, which facilitates the selection of various arrangement modes, and the distribution density may be effectively increased. When the first grooves 100*a* are only located in one wiring area 121, the first grooves 100*a* may be the strip-type groove, the annular groove, or the hole-type groove. When the first grooves 100*a* are located in the plurality of the wiring areas 121, the first grooves 100*a* may be the strip-type groove or the annular groove.

In some embodiments, the strip-type groove may be a linear strip-type groove, or a curved strip-type groove (for example, a strip-type groove in "S" shape), a polyline-like strip-type groove (for example, a polyline-like groove in "Z" shape) or a tree-like strip-type groove (for example, a groove in shape of a Chinese character "丰").

Figure 4:
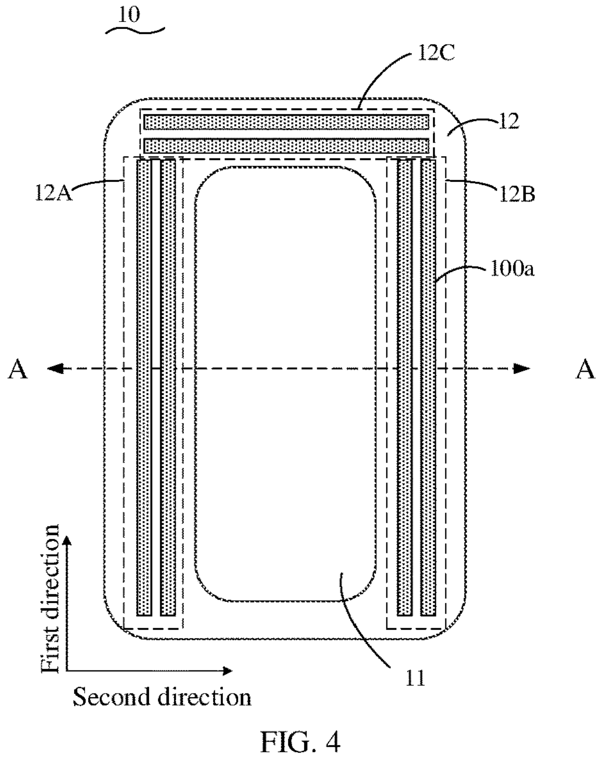
FIG. 4 is a schematic view illustrating a cross section of a first groove according to an embodiment.

Taking a case where the first direction is perpendicular to the alternating direction along which the first region 12A, the display region 11 and the second region 12B take place by turn and the second direction is parallel to the alternating direction along which the first region 12A, the display region 11 and the second region 12B take place by turn as an example, as illustrated in FIG. 4, the first groove 100*a* is a strip-type groove, and a plurality of continuously extending strip-type grooves are provided in the wiring area 121, so as to achieve the purpose of narrowing the wiring area 121 by providing a small number of strip-type grooves.

In some embodiments, the annular groove includes a closed annular groove or an open annular groove. The closed annular groove may be a circular groove, or may be an annular groove in any polygonal shape, for example, a rectangular ring-like groove. The open annular groove may be an open circular groove, or may be an open annular groove in any polygonal shape, for example, an open annular groove in a hexagonal shape, octagonal shape, dodecagonal shape, or other polygonal shapes. When an annular groove is located in multiple wiring areas, the annular groove is provided around the display area 11.

Figure 5:
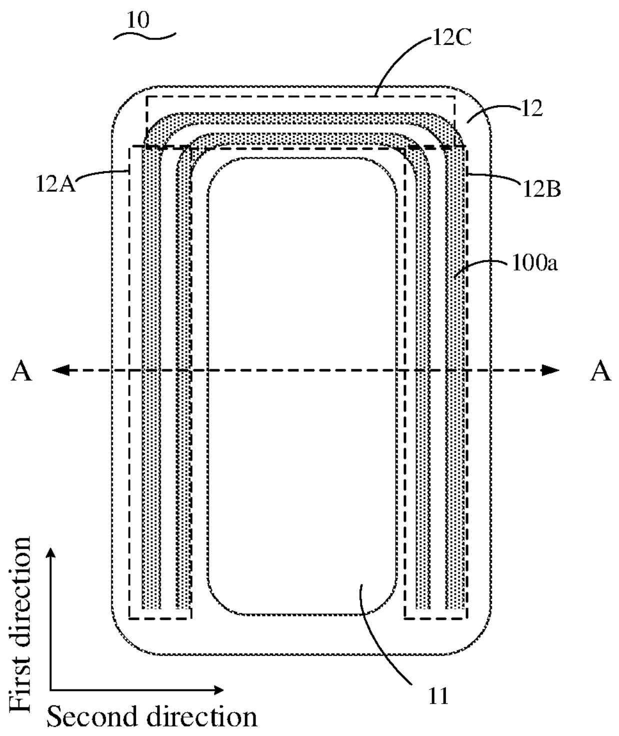
FIG. 5 is a schematic view illustrating a cross section of a first groove according to an embodiment.

Taking the case where the first direction is perpendicular to the alternating direction along which the first region 12A, the display region 11 and the second region 12B take place by turn and the second direction is parallel to the alternating direction along which the first region 12A, the display region 11 and the second region 12B take place by turn as an example, as illustrated in FIG. 5, the first grooves 100*a* each are an annular groove provided around the display area 11, each first groove 100*a* is located in the plurality of wiring areas 121, the plurality of first grooves 100*a* define a plurality of continuous annular grooves, so as to achieve the purpose of narrowing the wiring area 121 by providing a small number of annular grooves.

In some embodiments, the cross section of the hole-type groove is in a circular shape, a quasi-circular shape or a polygonal shape, where the number of sides of the polygon is not less than three, and the cross section is a section parallel to the length direction of the first groove 100*a*. A quasi-circular shape includes an ellipse shape and a pattern formed by at least two arcs, such as a shape of "8" consisting of two semi-arcs.

Figure 6:
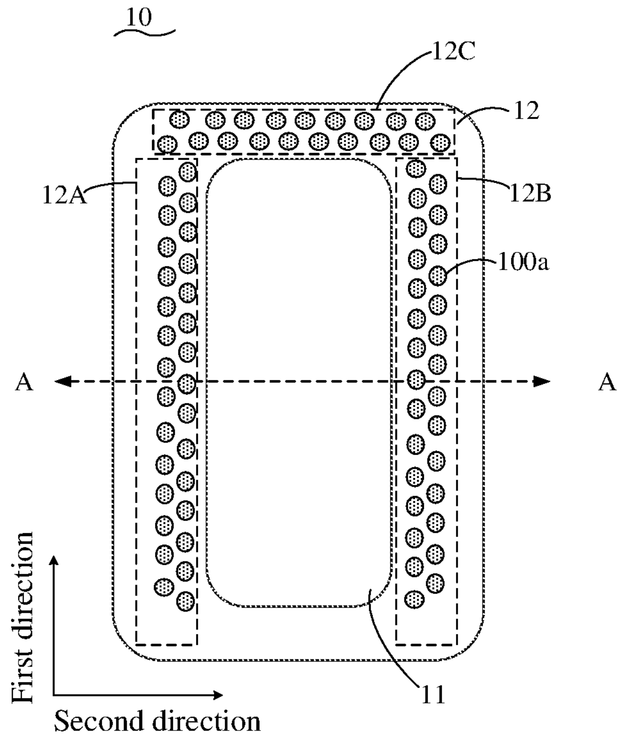
FIG. 6 is a schematic view illustrating a cross section of a first groove according to an embodiment.

Taking a case where the first direction is perpendicular to the alternating direction along which the first region 12A, the display region 11 and the second region 12B take place by turn and the second direction is parallel to the alternating directions along which the first region 12A, the display region 11 and the second region 12B take place by turn as an example: for example, as illustrated in FIG. 6, the cross section of the first groove 100*a* is in a circular shape, any two circular grooves adjacent in the first direction are arranged side by side and aligned, and any two circular grooves adjacent in the second direction are staggered with each other, so that the plurality of circular grooves are distributed densely, and the area of the exposed portion of the groove structure is further increased, thereby reducing the area of the wiring area 121.

Figure 7:
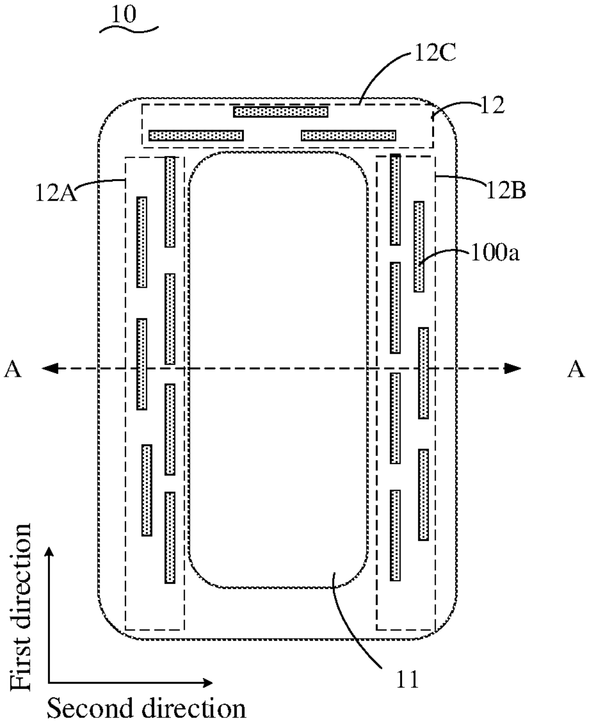
FIG. 7 is a schematic view illustrating a cross section of a first groove according to an embodiment.

For example, as illustrated in FIG. 7, the cross section of the first groove 100*a* is in a rectangular shape, any two rectangular grooves adjacent in the first direction are arranged side by side and aligned, and any two rectangular grooves adjacent in the second direction are staggered with each other, so that the plurality of rectangular grooves are distributed densely, the area of the exposed portion of the groove structure is further increased, thereby further reducing the size of the wiring area 121.

Figure 8:
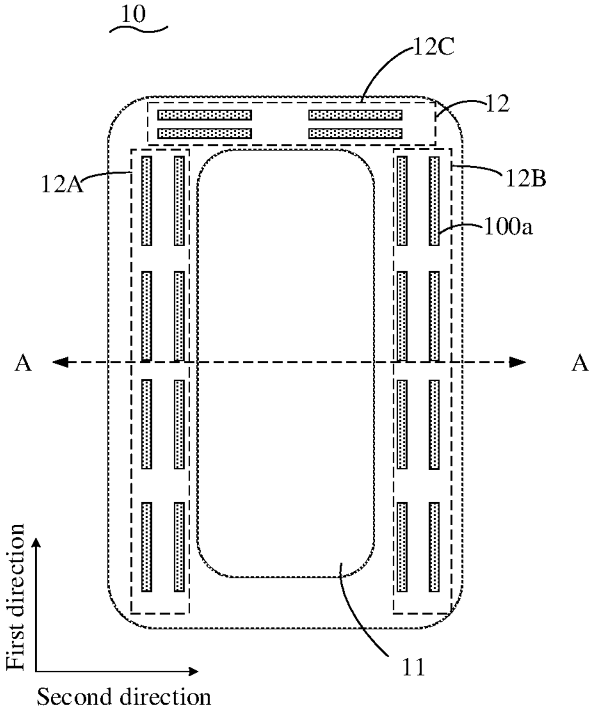
FIG. 8 is a schematic view illustrating a cross section of a first groove according to an embodiment.

For example, as illustrated in FIG. 8, the cross section of the first groove 100*a* is in a rectangular shape, any two rectangular grooves adjacent in the first direction are arranged side by side and aligned, and any two rectangular grooves adjacent in the second direction are arranged side by side and aligned, so that the plurality of rectangular grooves are distributed densely, the area of the exposed portion of the groove structure is further increased, thereby further reducing the area of the wiring area 121.

Figure 9:
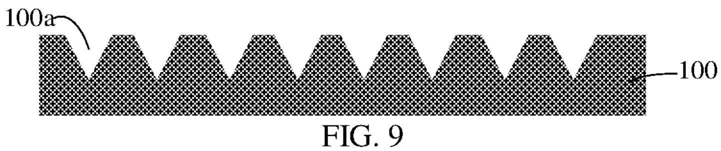
FIG. 9 is a schematic diagram illustrating a longitudinal section of a first groove according to an embodiment.
Figure 10:
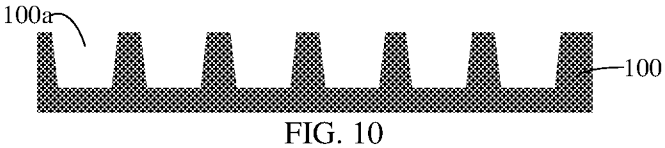
FIG. 10 is a schematic diagram illustrating a longitudinal section of a first groove according to an embodiment.
Figure 11:
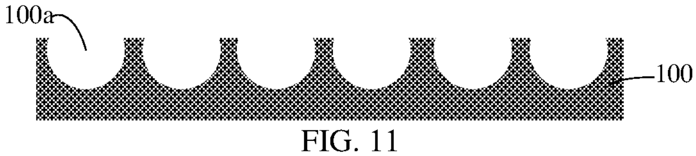
FIG. 11 is a schematic diagram illustrating a longitudinal section of a first groove according to an embodiment.

In some embodiments, the longitudinal section of the first groove 100*a* is in an open-top shape with an opening increasing gradually from a side facing away from the wiring 300 to a side close to the wiring 300, where the longitudinal section is a section perpendicular to the length direction of the first groove 100*a*. Therefore, the interlayer insulating layer 200 may be uniformly deposited and distributed on the exposed surface of the first grooves 100*a* to obtain the second grooves 200*a*, and then the wiring 300 may be uniformly deposited and distributed on the exposed surface of the second grooves 200*a*. The longitudinal section of the first groove 100*a* may be, but not limited to, in a triangle shape (as illustrated in FIG. 9), an inverted trapezoid shape (as illustrated in FIG. 10), a semicircle shape (as illustrated in FIG. 11) or a semi-ellipse shape. In other embodiments, the longitudinal section of the first groove 100*a* may also be in an open-top shape with an opening of substantially the same size in the depth direction, for example, the longitudinal section of the first groove 100*a* may be in a "U" shape.

In some embodiments, a width of the first groove 100*a* is greater than 3 μm, and a depth of the first groove 100*a* is greater than 3 μm, so that the first groove 100*a* has a large exposed area. It is easy to understand that, the depth of the first groove 100*a* is the dimension of the first groove 100*a* in a direction perpendicular to the base plate 100. Further, a spacing between two adjacent first grooves 100*a* is not less than 10 μm, which is beneficial to provide a complete first groove 100*a*, and improve the yield of the product. It may be understood that, two adjacent first grooves 100*a* may be provided to be spaced from each other, or may be continuously provided. Considering the manufacturing process, adjacent first grooves 100*a* may be mainly provided to be spaced from each other, so that there is small stress at the surface of the base plate 100, and the reliability is high.

Figure 12:
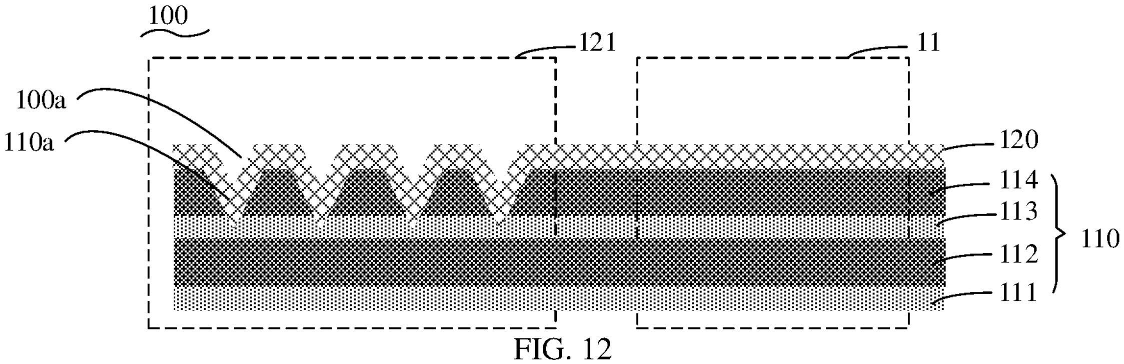
FIG. 12 is a schematic structural diagram of a base plate illustrated in the embodiment of FIG. 3.

In some embodiments, as illustrated in FIG. 12, the base plate 100 includes a flexible substrate 110 and an inorganic base layer 120.

The flexible substrate 110 is provided with a plurality of third grooves 110*a*, where the plurality of third grooves 110*a* are located in the non-display area 12. Positions of the third grooves 110*a* correspond to the positions of the first grooves 100*a* respectively, and the third grooves 110*a* are configured to receive the inorganic base layer 120 at the corresponding positions, so that the first grooves 100*a* with the matching shape and size are defined. For details of the shape, size and distribution of the third grooves 110*a*, reference may be made to the related description of the first grooves 100*a* in the above embodiments, which are not repeated herein.

Exemplarily, in the embodiments, the flexible substrate 110 includes a support plate 111, and includes a first organic base layer 112, a barrier layer 113, and a second organic base layer 114 that are sequentially provided on the support plate 111. The third grooves 110*a* are provided in the second organic base layer 114. The support plate 111 may be a glass support plate. The first organic base layer 112 and the second organic base layer 114 may be made of a same material, for example, each of them may be made of polyimide (PI), so as to effectively improve the transmittance. The barrier layer 113 may be made of a material capable of blocking water and oxygen, for example a material of SiN, SiO, SiC, and Al2O3. A thickness of the first organic base layer 112 may be 10 μm to 20 μm, a thickness of the barrier layer 113 may be 0.05 μm to 0.1 μm, and a thickness of the second organic base layer 114 may be 6 μm to 15 μm.

The inorganic base layer 120 is provided on the flexible substrate 110, and the inorganic base layer 120 is provided with the plurality of first grooves 100*a* at positions corresponding to the third grooves 110*a*, and the shape and size of the first grooves 100*a* match the shape and size of the third grooves 110*a*. The inorganic base layer 120 may be a SiO, SiN, or a-Si inorganic layer or other inorganic layer. The inorganic base layer 120 may have a thickness of 1 μm to 5 μm.

Grooves are provided in the flexible substrate 110, and it is beneficial to simplify the process of providing such grooves as the flexible substrate 110 has high flexibility. Moreover, the thickness of the flexible substrate 110 is 15 μm to 50 μm, and deep third grooves 110*a* may be provided in the flexible substrate 110 so as to increase the area of the exposed portion of the flexible substrate 110. The inorganic base layer 120 is formed on the flexible substrate 110 on which the grooves haven been provided. Since the inorganic base layer 120 is generally a film deposited on a whole surface, it is beneficial to obtain a uniform thickness of the film, and the first grooves 100*a* with a smooth exposed surface and uniform thickness are obtained. Since the inorganic base layer 120 has high rigidity, it is beneficial to stabilize the shape of the first grooves 100*a*.

In the embodiments, the interlayer insulating layer 200 is provided on the base plate 100 and covers the first grooves 100*a*, and the interlayer insulating layer 200 is provided with a plurality of second grooves 200*a* at positions corresponding to the first grooves 100*a*. For details of the shape, size and distribution of the second grooves 200*a*, reference may be made to the related description of the first grooves 100*a* in the above embodiments, which are not repeated herein. The material of the interlayer insulating layer 200 includes SiNx and SiOx, so that the second grooves 200*a* have high density and flatness.

The thickness of the interlayer insulating layer 200 is generally 0.25 μm to 0.50 μm, for example, 0.3 μm, and the thickness of the base plate 100 is generally 15 μm to 50 μm, which is much greater than the thickness of the interlayer insulating layer 200. Therefore, the depths of the first grooves 100*a* and the second grooves 200*a* may be much greater than the thickness of the interlayer insulating layer 200 located in the display area 11. Compared with a case where grooves are only provided in the interlayer insulating layer 200 for increase of the area of the exposed portion, the second grooves 200*a* of the embodiments enable the area of the exposed portion of the interlayer insulating layer 200 to be increased, so that the size of the non-display area 12 can be effectively reduced to improve the screen-to-body ratio.

In the embodiments, the wiring 300 is provided in the wiring area 121 of the interlayer insulating layer 200, and fills the second grooves 200*a*.

The wiring 300 is a cathode wiring, the cathode wiring is connected with a cathode voltage input terminal of the display panel. The wiring 300 is provided around the display area 11, and is electrically connected with a driving chip to receive a low voltage VSS from the driving chip and transmit the voltage to the cathode, so as to drive the light emitting device in the display area 11 to emit light. Exemplarily, there are four non-display areas 12 respectively located at the four edge sides of the display area 11, and the wiring 300 is provided in three non-display areas 12 respectively located at three edge sides of the display area 11, for example, it is provided on the non-display areas 12 located at the upper edge side, the left edge side and the right edge side of the display area 11. The driving chip is provided in the non-display area 12 located at the lower edge side of the display area 11. The wiring 300 may be made of a metal material, and the wiring 300 may be a single metal layer or a metal stack layer such as a Ti/Al/Ti metal stack layer.

It may be understood that, if the occupied area of the wiring area 121 that is occupied by the wiring 300 is too small, the resistance of the cathode wiring is increased, which would cause an optical problem of uneven display brightness of the display screen. In order to ensure that the display screen can normally display an image, it is usually required that the wiring area 121 has a width ranging from 200 μm to 220 μm. In the embodiments, by means of the second grooves 200*a*, the effective contact area between the wiring 300 and the interlayer insulation layer 200 can be increased, the surface resistance of the wiring area 121 can be reduced. On this basis, the size of the wiring area 121 may be reduced, thereby reducing the area occupied by the cathode wiring 300 on the display screen, and then effectively enlarging the area actually used for display, and achieving the purpose of reducing the frame of the display screen. The width of the wiring 300 is expected to be reduced to be in a range between 100 μm and 150 μm.

The display panel provided in the embodiments includes the base plate 100, the interlayer insulating layer 200 and the wiring 300. The base plate 100 is provided with a plurality of first grooves 100*a* in the non-display area 12. The interlayer insulating layer 200 is provided on the base plate 100 and covers the first grooves 100*a*, and the interlayer insulating layer 200 is provided with a plurality of second grooves 200*a* at positions corresponding to the first grooves 100*a*. The wiring 300 is provided in the wiring area 121 of the interlayer insulating layer 200 and fills the second grooves 200*a*. By means of the first grooves 100*a* and the second grooves 200*a*, the effective contact area between the wiring 300 and the interlayer insulation layer 200 can be increased, the surface resistance of the wiring area 121 can be reduced; on this basis, the size of the wiring area 121 can be reduced, thus reducing the area occupied by the wiring 300 on the display screen, and effectively enlarging the area actually used for display. Therefore, the purpose of reducing the frame of the display screen is achieved, and the display effect is improved.

It may be noted that, in the embodiments, the display panel is not limited to the above laminated structure, and various layers may be added with a material with special functions based on different requirements. For example, other functional materials are added to a film of a single function to obtain a film of multiple functions.

Figure 13:
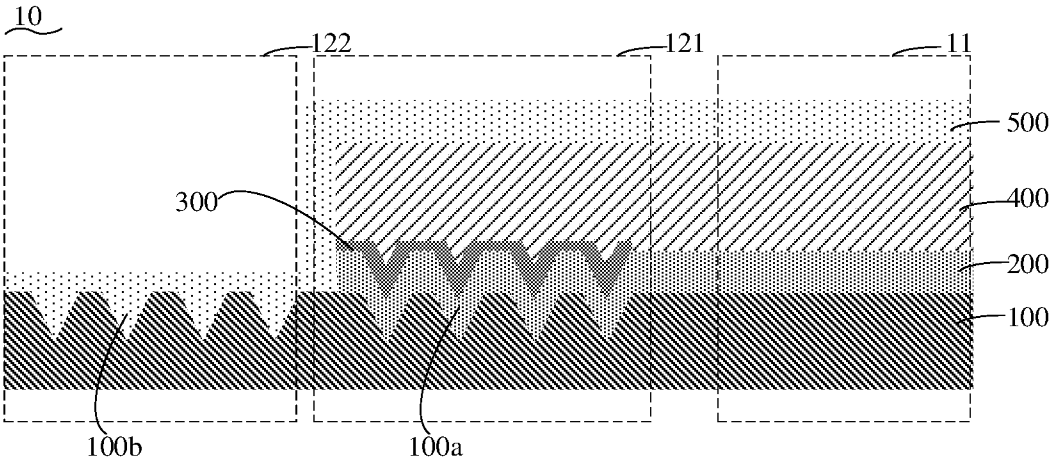
FIG. 13 is a schematic cross-sectional view of a display panel taken along line A-A according to another embodiment.

FIG. 13 is a schematic structural diagram of a display panel according to an embodiment. The display panel 10 includes a base plate 100, an interlayer insulating layer 200, and a wiring 300, and it further includes a light-emitting array structure 400 and an encapsulation structure 500.

The display panel 10 includes a display area 11 and a non-display area 12. The non-display area 12 includes a wiring area 121 and the encapsulation area 122, and the encapsulation area 122 is located on a side of the wiring area 121 away from the display area 11. For the description of the base plate 100, the interlayer insulating layer 200, the wiring 300 and the first grooves 100*a*, reference may be made to the related description in the above embodiments, which are not repeated herein.

In the embodiment, the base plate 100 is further provided with a plurality of fourth grooves 100*b*, where the plurality of fourth grooves 100*b* are located in the encapsulation area 122. The fourth grooves 100*b* are configured to receive the encapsulation structure 500 at the corresponding position. The provision of the fourth grooves 100*b* may enable the area of the exposed portion of the encapsulation area 122 on the base plate 100 to be increased, and thus the effective contact area between the encapsulation structure 500 and the base plate 100 is increased; as such, the encapsulation structure 500 can effectively prevent the internal structure of the display panel from being eroded by water and oxygen, which effectively improves the service life of the display panel; meanwhile, it enables the occupied area in the horizontal plane of the non-display area 12 that is occupied by the encapsulation area 122 to be reduced, so as to narrow the non-display area 12. In some embodiments, the number of the fourth grooves 100*b* is not less than 2, so that the effective contact area between the encapsulation structure 500 and the base plate 100 can be greatly increased.

In some embodiments, the base plate 100 is provided with a plurality of encapsulation areas 122. The fourth grooves 100*b* are located in at least one encapsulation area 122, so that the fourth grooves 100*b* enable the area of the exposed portion of the at least one encapsulation area 122 on the base plate 100 to be increased, so as to increase the effective contact area between the encapsulation structure 500 and the base plate 100. When the fourth grooves 100*b* are located in the plurality of encapsulation areas 122, the fourth grooves 100*b* enable the area of the exposed portions of the plurality of encapsulation area 122 on the base plate 100 to be increased, thereby further increasing the effective contact area between the encapsulation structure 500 and the base plate 100

In some embodiments, there are a plurality of fourth grooves 100*b*. In each encapsulation area 122, at least two fourth grooves 100*b* are arranged along a third direction and/or at least two fourth grooves 100*b* are arranged along a fourth direction. The third direction and the fourth direction intersect with each other, and an included angle between the first direction and the second direction is greater than 0 degree and less than 180 degrees.

When at least two fourth grooves 100*b* are arranged along the third direction or at least two fourth grooves 100*b* are arranged along the fourth direction, the plurality of fourth grooves 100*b* define a plurality of groove structures interruptedly distributed in the same arrangement direction, so as to achieve the purpose of narrowing the encapsulation area 122. The provision of the plurality of groove structures in the same direction may simplify the processing steps, which is beneficial to large-scale production of the product.

When at least two fourth grooves 100*b* are arranged along the third direction and at least two fourth grooves 100*b* are arranged along the fourth direction, the plurality of fourth grooves 100*b* define, in each of multiple arrangement directions, a plurality of groove structures interruptedly distributed. This can improve the distribution density of the fourth grooves 100*b*, and improve the bonding strength between the encapsulation structure 500 and the base plate 100. Further, the plurality of fourth grooves 100*b* are arranged in an array along each of the third direction and the fourth direction, and thus a plurality of groove structures are defined by arranging the plurality of fourth grooves 100*b* in an array along each of the multiple directions, this further improves the distribution density of the groove structures. It may be understood that, in the area where the array is arranged, every two adjacent fourth grooves 100*b* may be arranged side-by-side and aligned, or may be arranged to be staggered with each other, depending on the cross-sectional shape and distribution density of the fourth grooves 100*b*.

In some embodiments, the non-display area 12 includes a first area 12A and a second area 12B that are provided on two opposite sides of the display area 11. The non-display area 12 further includes a third area 12C connecting the first area 12A and the second area 12B. The third direction is perpendicular to an alternating direction along which the first area 12A, the display area 11, and the second area 12B take place by turn. In each of the encapsulation areas 122 of the first area 12A and the second area 12B, at least one fourth groove 100*b* extends along the third direction. In the wiring area of the third area 12C, at least one fourth groove 100*b* extends along the alternating direction. The fourth groove(s) 100*b* extending along the third direction in the first area 12A and the second area 12B may greatly increase the area of the exposed portion in the extending direction, and may effectively reduce the area occupied by the fourth groove(s) 100*b* in the alternating direction, thereby further effectively improving the screen-to-body ratio. The fourth groove(s) 100*b* extending along the alternating direction in the third area 12C may greatly increase the area of the exposed portion in the extending direction, and effectively reduce the area occupied by the first grooves 100*a* in the third direction, thereby effectively improving the screen-to-body ratio. When the arrangement direction of the plurality of fourth grooves 100*b* is the same as the extension direction of the fourth grooves 100*b*, the number of the fourth grooves arranged along the arrangement direction is further reduced, thereby further simplifying the processing, and facilitating the large scale production of the product.

In some embodiments, the plurality of encapsulation areas 122 surround the edge of the display area 11, and each encapsulation area 122 is provided with at least one fourth groove 100*b*; in this way, it is ensured that the encapsulation area 122 located at each edge side of the display area 11 may be narrowed.

In some embodiments, the plurality of encapsulation areas 122 are symmetrically distributed with respect to an axis of symmetry, the fourth grooves 100*b* are symmetrically arranged with respect to the axis of symmetry or the plurality of fourth grooves 100*b* are symmetrically distributed with respect to the axis of symmetry, so that the size of the non-display area 12 may be reduced symmetrically, and the display effect of the display screen is improved.

In some embodiments, the fourth groove 100*b* are a strip-type groove, an annular groove, or a hole-type groove. Each of the strip-type groove and the annular groove has high continuity in extension along the length direction thereof, which enables high area utilization in the extension direction, and facilitates the provision of a deep groove. The hole-type groove has low continuity in extension along the length direction thereof, which facilitates the selection of various arrangement modes, and the distribution density may be effectively increased. When the fourth grooves 100*b* are only located in one encapsulation area 122, the fourth grooves 100*b* may be the strip-type groove, the annular groove, or the hole-type groove. When the fourth grooves 100*b* are located in the plurality of the encapsulation areas 122, the fourth grooves 100*b* may be the strip-type groove or the annular groove.

In some embodiments, the strip-type groove may be a linear strip-type groove, or a curved strip-type groove (for example, a strip-type groove in "S" shape), a polyline-like strip-type groove (for example, a polyline-like groove in "Z" shape) or a tree-like strip-type groove (for example, a groove in shape of a Chinese character "丰").

Figure 14:
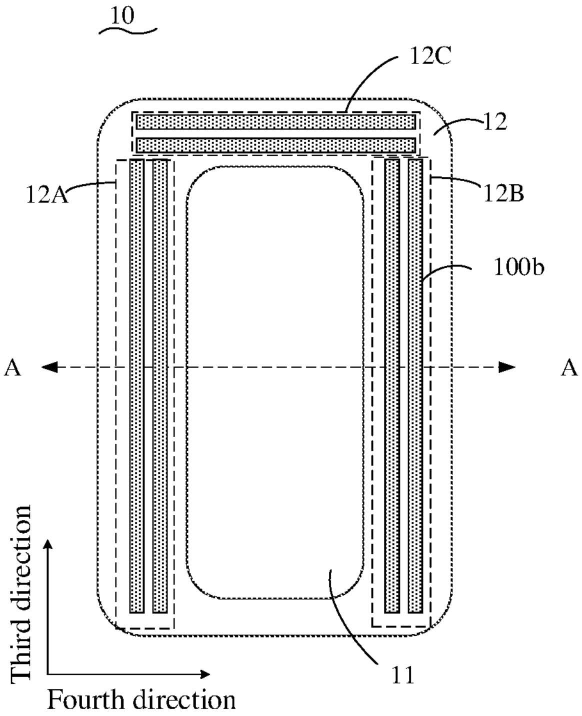
FIG. 14 is a schematic view illustrating a cross section of a fourth groove according to an embodiment.

Taking a case where the third direction perpendicular to the alternating direction along which the first region 12A, the display region 11 and the second region 12B take place by turn and the fourth direction is parallel to the alternating direction along which the first region 12A, the display region 11 and the second region 12B take place by turn as an example, as illustrated in FIG. 14 (in which the wiring area is not illustrated), the fourth groove 100*b* is a strip-type groove, and a plurality of continuously extending strip-type grooves are provided in the encapsulation area 122, so as to achieve the purpose of narrowing the encapsulation area 122 by providing a small number of strip-type grooves.

In some embodiments, the annular groove includes a closed annular groove or an open annular groove. The closed annular groove may be a circular groove, or may be an annular groove in any polygonal shape, for example, a rectangular ring-like groove. The open annular groove may be an open circular groove, or may be an open annular groove in any polygonal shape, for example, an open annular groove in a hexagonal shape, octagonal shape, dodecagonal shape, or other polygonal shapes. When an annular groove is located in multiple wiring areas, the annular groove is provided around the display area 11.

Figure 15:
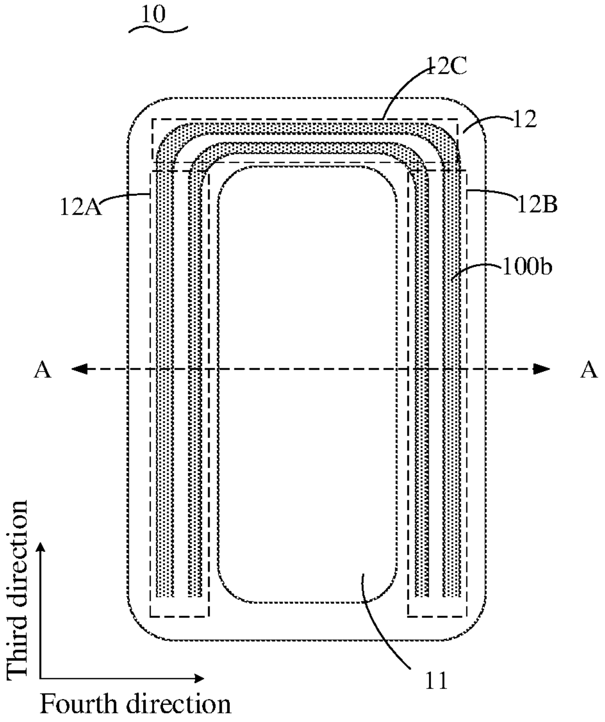
FIG. 15 is a schematic view illustrating a cross section of a fourth groove according to an embodiment.

Taking a case where the third direction perpendicular to the alternating direction along which the first region 12A, the display region 11 and the second region 12B take place by turn and the fourth direction is parallel to the alternating direction along which the first region 12A, the display region 11 and the second region 12B take place by turn as an example, as illustrated in FIG. 15 (in which the wiring area is not illustrated), the fourth grooves 100*b* each are an annular groove provided around the display area 11, each fourth groove 100*b* is located in the plurality of encapsulation areas 122, the plurality of fourth grooves 100*b* define a plurality of continuous annular grooves, so as to achieve the purpose of narrowing the encapsulation area 122 by providing a small number of annular grooves.

In some embodiments, the cross section of the hole-type groove is in a circular shape, a quasi-circular shape or a polygonal shape, where the number of sides of the polygon is not less than three, and the cross section is a section parallel to the length direction of the fourth groove 100*b*. A quasi-circular shape includes an ellipse shape and a pattern formed by at least two arcs, such as a shape of "8" consisting of two semi-arcs.

In some embodiments, the longitudinal section of the fourth groove 100*b* is in an open-top shape with an opening increasing gradually from a side facing away from the wiring 300 to a side close to the wiring 300, and the longitudinal section is a section perpendicular to the length direction of the fourth groove 100*b*. Therefore, the encapsulation structure 500 may be uniformly deposited and distributed on the exposed surface of the fourth grooves 100*b*. The longitudinal section of the fourth groove 100*b* may be, but not limited to, a triangle shape, an inverted trapezoid shape, a semicircle shape or a semi-ellipse shape. In other embodiments, the longitudinal section of the fourth groove 100*b* may also be in an open-top shape with an opening of substantially the same size in the depth direction, for example, the longitudinal section of the fourth grooves 100*b* may be in a "U" shape.

In some embodiments, a width of the fourth groove 100*b* is greater than 3 μm, and a depth of the fourth groove 100*b* is greater than 3 μm, so that the fourth groove 100*b* has a large exposed area. It is easy to understand that, the depth of the fourth groove 100*b* is the dimension of the fourth groove 100*b* in a direction perpendicular to the base plate 100. Further, a distance between two adjacent fourth grooves 100*b* is not less than 10 μm, which is beneficial to provide a complete fourth groove 100*b*, and improve the yield of the product. It may be understood that, two adjacent fourth grooves 100*b* may be provided to be spaced from each other, or may be continuously provided. Considering the manufacturing process, adjacent fourth grooves 100*b* may be mainly provided to be spaced from each other, so that there is small stress at the surface of the base plate 100, and the reliability is high.

In some embodiments, as illustrated in FIG. 16, the base plate 100 includes a flexible substrate 110 and an inorganic base layer 120.

The flexible substrate 110 is provided with a plurality of third grooves 110*a* and a plurality of fifth grooves 110*b*, where the plurality of third grooves 110*a* are located in the wiring area 121. Positions of the third grooves 110*a* correspond to the positions of the first grooves 100*a* respectively, and the third grooves 110*a* are configured to receive the inorganic base layer 120 at corresponding positions, so that the first grooves 100*a* with the matching shape and size are defined. Positions of the fifth grooves 110*b* correspond to positions of the fourth grooves 100*b* respectively, and the fifth grooves 110*b* are configured to receive the inorganic base layer 120 at the corresponding positions, so that the fourth grooves 100*b* with the matching shape and size are defined. Exemplarily, in the embodiment, the flexible substrate 110 includes a support plate 111, and includes a first organic base layer 112, a barrier layer 113, and a second organic base layer 114 that are sequentially provided on the support plate 111. The third grooves 110*a* and the fifth grooves 110*b* are provided in the second organic base layer 114. For details of the shape, size and distribution of the third grooves 110*a*, reference may be made to the related description of the above embodiments. For the first organic base layer 112, the barrier layer 113, the second organic base layer 114, and the inorganic base layer 120, reference may be made to the related description of the above embodiments, and details thereof are not repeated herein. For details of the shape, size and distribution of the fifth grooves 110*b*, reference may be made to the related description of the fourth grooves 100*b* in the foregoing embodiment, which are not repeated herein.

The third grooves 110*a* and the fifth grooves 110*b* are provided in the flexible substrate 110, and it is beneficial to simplify the process of providing such grooves as the flexible substrate 110 has a high flexibility. Moreover, the thickness of the flexible substrate 110 is generally 15 μm to 50 μm, and deep grooves may be provided in the flexible substrate 110 so as to increase the area of the exposed portion of the flexible substrate 110. The inorganic base layer 120 is formed on the flexible substrate 110 on which the grooves haven been provided. Since the inorganic base layer is generally a film deposited on a whole surface, it is beneficial to obtain a uniform thickness of the film, and the first grooves 100*a* and the fourth grooves 100*b* with a smooth exposed surface and uniform thickness are obtained. Since the inorganic base layer 120 has high rigidity, it is beneficial to stabilize the shape of the first grooves 100*a* and the fourth grooves 100*b*.

In the embodiments, the light emitting array structure 400 is provided on the interlayer insulating layer 200 and the wiring 300, and the light emitting array structure 400 is partially embedded in the interlayer insulating layer 200. The light emitting array structure 400 is configured to implement a display function in the display area 11.

Exemplarily, as illustrated in FIG. 17, in the embodiments, the light emitting array structure 400 includes a planarization layer 410, a pixel defining layer 420, a driving unit 430, and a light emitting unit 440.

The planarization layer 410 is provided on the interlayer insulating layer 200 and the wiring 300, and is configured to compensate the unevenness caused by the driving unit 430, the wiring 300 and the like. The planarization layer 410 is made of a conventional material, which is not limited herein. It is notable that the planarization layer 410 is generally made of an organic material. In the preparation process of the planarization layer 410, a dam is usually provided between the wiring area(s) 121 of the planarization layer 410 and the display area 11, so as to prevent the organic material from overflowing during inkjet printing. The provision of the dam causes the width of the non-display area 12 to be increased, which is not conducive to achieving a narrow frame. In the present embodiments, due to the groove structures of the wiring 300, the wiring 300 itself provides a blocking function, which enables the dam to be omitted so as to shorten the edge of the planarization layer 410, and thus further narrow the frame.

The pixel defining layer 420 is provided on the planarization layer 410, and is configured to confine the light emitting unit 440 within a sub-pixel region defined by the pixel defining layer 420, thereby achieving high resolution and full color display. Generally, a groove structure is provided in the pixel defining layer 420 to serve as a pixel dent, and each pixel dent corresponds to one sub-pixel region. The pixel defining layer 420 is made of a conventional material, which is not limited herein.

The driving unit 430 is provided in the insulating layer and the planarization layer 410 to drive the light emitting unit 440 to emit light. In some embodiments, the driving unit 430 is provided in the display area 11 and is close to the wiring area 121, so as to shorten the length of the signal wiring 300, and improve the reliability of signal transmission; in addition, the occupied area of the non-display area 12 that is occupied by the wiring 300 is further reduced, so as to further improve the screen-to-body ratio.

The light emitting unit 440 is provided at the pixel defining layer 420, and penetrates through the pixel defining layer 420 and a part of the planarization layer 410. The light emitting unit 440 is electrically connected with the driving unit 430, and the light emitting unit 440 and the driving unit 430 are both located in the display area 11. Each sub-pixel region of the pixel defining layer 420 is provided with one or more light-emitting units 440. For example, in the embodiments, each sub-pixel region includes three light-emitting units 440 with different colors, which are red, green and blue, respectively; as such, when the driving unit 430 applies an appropriate voltage, the light-emitting units 440 generate light in three primary colors of red, green and blue (RGB).

In some embodiments, the light-emitting units 440 are in one-to-one correspondence with the driving units 430, and each driving unit 430 is configured to drive its corresponding light-emitting unit 440 to emit light (as illustrated in FIG. 17, and only one driving unit 430 and one light-emitting unit 440 are illustrated in the figure). In some other embodiments, one driving unit 430 may also correspond to two or more light-emitting units 440, and the driving unit 430 synchronously sends a same driving signal to the two or more light-emitting units 440, thereby effectively saving the material cost of the driving circuit and the space occupied by the driving circuit.

The driving unit 430 may be any type of transistor, for example, a bipolar junction transistor (BJT), a field effect transistor (FET), or a thin film transistor (TFT). The light-emitting unit 440 may be a light-emitting device such as an organic light-emitting diode (OLED), a quantum dot light-emitting diode (QLED), and an inorganic light-emitting diode.

Exemplarily, in the embodiments, the driving unit 430 is a TFT including an active layer 431, a gate insulating layer 432, a gate layer 433 and a source/drain layer 434 (as illustrated in FIG. 17). The active layer 431 is provided on the base plate 100 and is covered by the interlayer insulating layer 200. The gate insulating layer 432 is provided in the interlayer insulating layer 200 and is located on the active layer 431. The gate layer 433 is provided in the interlayer insulating layer 200 and is located on the gate insulating layer 432. The source/drain layer 434 is provided on the interlayer insulating layer 200, and penetrates through the interlayer insulating layer 200 to reach a level of the gate insulating layer 432, and the source/drain layer 434 is covered by the planarization layer 410. The gate insulating layer 432 is configured to insulate the source/drain layer 434 from the gate layer 433, to prevent a short circuit from being generated due to contact of the two electrode layers. Each layer of the driving unit 430 is made of a conventional material, which is not limited herein.

Exemplarily, in the embodiments, the light-emitting unit 440 is an OLED, including an anode 441, a hole function layer 442, a light-emitting layer 443, and an electron function layer/cathode 444 (as illustrated in FIG. 17) stacked in sequence. The anode 441 is provided on the planarization layer 410 and is connected, through a through hole of the planarization layer 410, with the source/drain layer 434 of the driving unit 430. The hole function layer 442 is provided on the anode 441 and covers sidewalls of each sub-pixel region defined by the pixel defining layer 420, and is configured to control transmission of holes, so as to control recombination of the holes with electrons in the light emitting layer, thereby improving the light emitting efficiency. The light emitting layer 443 is provided on the hole function layer 442. The light emitting layer 443 at least includes a light emitting material layer, where the light emitting material includes an organic light emitting material, and it may be provided with a light emitting material emitting light at a proper wavelength based on the display requirements. The electron function layer/cathode 444 is provided on the light emitting layer 443, and the electron function layer controls the transmission of electrons, so as to control the recombination of the electrons with the holes in the light emitting layer, thereby improving the light emitting efficiency. Each layer of the light-emitting unit 440 is made of a conventional material, which is not limited herein.

In the present embodiments, the package structure 500 is provided on the light emitting array structure 400, and covers the light emitting array structure 400 and the fourth grooves 100*b*, so as to effectively prevent the internal structure of the display panel from being eroded by water and oxygen, thereby improving the service life and reliability of the display panel. In the embodiments, through the provision of the fourth grooves 100*b*, the area of the exposed portion of the encapsulation area 122 of the base plate 100 may be increased, which increases the effective contact area between the encapsulation structure 500 and the base plate 100. In addition, the groove structures of the fourth grooves 100*b* themselves have a function of blocking water and oxygen. As such, the encapsulation structure 500 can effectively prevent the internal structure of the display panel from being eroded by water and oxygen, which effectively prolongs the service life of the display panel; meanwhile, it enables the occupied area in the horizontal plane of the non-display area 12 that is occupied by the encapsulation area 122 to be reduced, so as to narrow the non-display area 12. The width of the encapsulation region 122 is expected to be reduced, from the existing range between 300 μm to 400 μm, to be less than 150 μm.

It may be understood that the encapsulation structure 500 may be a structure of one or more layers, and it may be an organic film or an inorganic film, or may be a laminated structure of an organic film and an inorganic film.

For example, as illustrated in FIG. 17, in the embodiments, the encapsulation structure 500 includes two inorganic encapsulation layers (which are a first inorganic encapsulation layer 510 and a second inorganic encapsulation layer 530, where the first inorganic encapsulation layer is close to the base plate 100 side and covers the fourth grooves 100*b*) and an organic encapsulation layer 520 provided between the two adjacent inorganic encapsulation layers. By covering the fourth grooves 100*b* with the first inorganic encapsulation layer 510, the encapsulation structure 500 may effectively prevent the internal structure of the display panel from being eroded by water and oxygen, which effectively improves the service life of the display panel; in addition, the occupied area in the horizontal plane of the non-display area 12 that is occupied by the encapsulation area 122 is reduced, so as to narrow the non-display area 12.

An orthographic projection of the first inorganic encapsulation layer 510 on the base plate 100 coincides with an orthographic projection of the second inorganic encapsulation layer 530 on the base plate 100, and an orthographic projection of the organic encapsulation layer 520 on the base plate 100 is located within the orthographic projection of the second inorganic encapsulation layer 530 on the base plate 100. The inorganic encapsulation layer has a good property of blocking the water and oxygen, but it has a large stress. The organic encapsulation layer has good toughness, which enables a good buffering force to be provided, but the organic encapsulation layer has a poor property of blocking the water and oxygen. Therefore, the inorganic encapsulation layer is required to isolate the organic encapsulation layer from air. The first inorganic encapsulation layer 510 and the second inorganic encapsulation layer 530 may be a dense inorganic films such as a SiN, SiO, Al2O3, or SiON film, and the organic encapsulation layer 520 may be an organic film such as an epoxy resin, polyurethane, or silicon-based film.

The display panel provided in the embodiment includes a base plate 100, an interlayer insulation layer 200, a wiring 300, a light-emitting array structure 400 and a encapsulation structure 500. The base plate 100 is provided with a plurality of first grooves 100*a* located in the wiring area 121 and a plurality of fourth grooves 100*b* located in the encapsulation area 122. The interlayer insulation layer 200 is provided on the base plate 100 and covers the first grooves 100*a*, and the interlayer insulation layer 200 is provided with a plurality of second grooves 200*a* at positions corresponding to the first grooves 100*a*. The wiring 300 is provided in the wiring area 121 of the interlayer insulation layer 200 and fills the second grooves 200*a*. The light-emitting array structure 400 is provided on the interlayer insulation layer 200 and the wiring 300, and the light-emitting array structure 400 is partially embedded in the interlayer insulation layer 200. The encapsulation structure 500 is provided on the light-emitting array structure 400, and covers the light-emitting array structure 400 and the fourth grooves 100*b*. By means of the first grooves 100*a* and the second grooves 200*a*, the effective contact area between the wiring 300 and the interlayer insulating layer 200 can be increased, and the surface resistance of the wiring area 121 can be reduced; on this basis, the size of the wiring area 121 can be reduced, and the area occupied by the wiring 300 on the display screen can be reduced. Through the provision of the fourth grooves 100*b*, the encapsulation structure 500 can more effectively prevent the display panel from being corroded by water and oxygen, which prolongs the service life of the display panel; in addition, the occupied area in the horizontal plane of the non-display area 12 that is occupied by the encapsulation area 122 can be reduced. In this way, both the wiring area 121 and the encapsulation area 122 are reduced, the size of the non-display area 12 can be effectively reduced, and the area actually used for display is effectively enlarged; thus, the screen-to-body ratio of the display screen is improved, and the display effect is improved.

It may be noted that the display panel is not limited to the above laminated structure, and various layers may be added with a material with special functions based on different requirements. For example, other functional materials are added to a film of a single function to obtain a film of multiple functions. In addition, the stacking sequence of the various films in the display panel may be changed based on the required functions, and other functional films may be added as required.

As illustrated in FIG. 18, FIG. 18 is a flowchart of a preparation method for a display panel according to an embodiment. For introduction to the structure of the display panel, reference may be made to the related description of the above embodiments, which is not repeated herein. The preparation method includes blocks 102 to 106.

At block 102, a base plate is provided, and a plurality of first grooves are provided. At block 104, an interlayer insulating layer is formed on the base plate, in such a manner that the interlayer insulating layer covers the first grooves and a plurality of second grooves located at positions corresponding to the first grooves are obtained in the interlayer insulating layer. The interlayer insulating layer may be formed by conventional processes and methods in the art, and details there are not described herein.

At block 106, a wiring is formed on a part of the interlayer insulating layer located in the non-display area, where the wiring fills the second grooves. The wiring may be formed by using conventional processes and methods in the art, and details there are not described herein.

Figure 19:
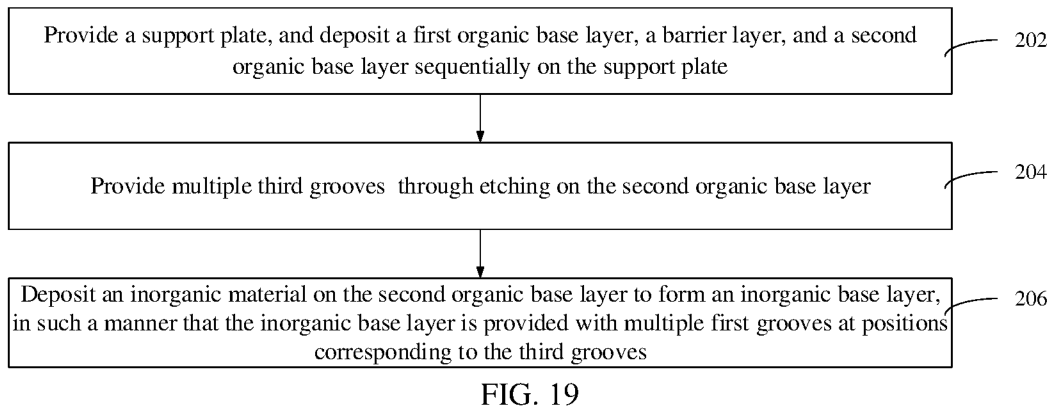
FIG. 19 is a flowchart of block 102 according to an embodiment.

In some embodiments, as illustrated in FIG. 19, block 102 includes blocks 202 to 206.

At block 202, a support plate is provided, and a first organic base layer, a barrier layer, and a second organic base layer are sequentially deposited on the support plate. Exemplarily, the first organic base layer and the second organic base layer are deposited by a polyimide coating process, and the barrier layer is formed by a chemical vapor deposition (CVD) process. At block 204, a plurality of third grooves are provided through etching on the second organic base layer. At block 206, an inorganic material is deposited on the second organic base layer to form an inorganic base layer, in such a manner that the inorganic base layer is provided with the plurality of first grooves at positions corresponding to the third grooves. Exemplarily, the inorganic base layer is formed by the CVD process.

In the method provided in the embodiments, through the provision of the first grooves and the second grooves, the effective contact area between the wiring and the interlayer insulation layer can be increased, and the surface resistance of the wiring area can be reduced. On this basis, the size of the wiring area can be reduced, the area occupied by the wiring on the display screen is reduced, and the size of the non-display area can be effectively reduced. Thus, the area actually used for display is effectively enlarged, the screen-to-body ratio of the display screen is improved, and the display effect is improved.

Figure 20:
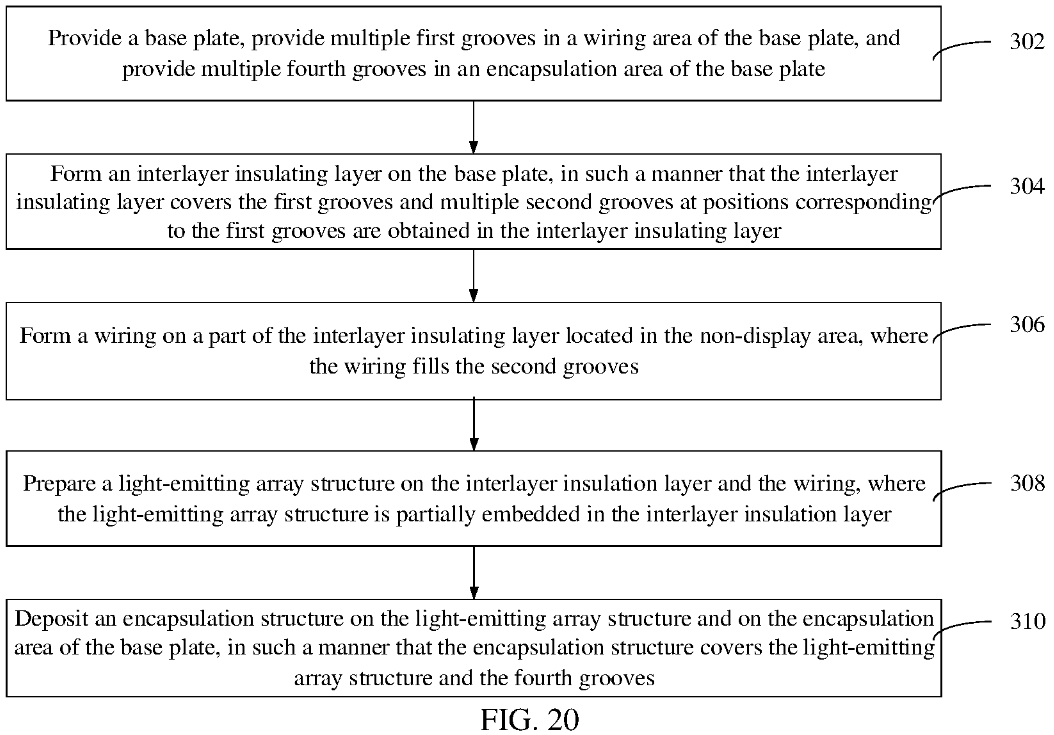
FIG. 20 is a flowchart of a preparation method for a display panel according to another embodiment.

As illustrated in FIG. 20, FIG. 20 is a flowchart of a preparation method for a display panel according to another embodiment. The preparation method includes blocks 302 to 306.

At block 302, a base plate is provided, a plurality of first grooves are provided in a wiring area of the base plate, and a plurality of fourth grooves are provided in an encapsulation area of the base plate.

At block 304, an interlayer insulating layer is formed on the base plate, in such a manner that the interlayer insulating layer covers the first grooves and a plurality of second grooves at positions corresponding to the first grooves are obtained in the interlayer insulating layer.

At block 306, a wiring is formed on a part of the interlayer insulating layer located in the non-display area, where the wiring fills the second grooves.

At block 308, a light-emitting array structure is prepared on the interlayer insulation layer and the wiring, where the light-emitting array structure is partially embedded in the interlayer insulation layer.

At block 310, an encapsulation structure is deposited on the light-emitting array structure and on the encapsulation area of the base plate, in such a manner that the encapsulation structure covers the light-emitting array structure and the fourth grooves.

Blocks 304 and 306 may be performed with conventional processes and methods in the art, and details thereof are not described herein.

Figure 21:
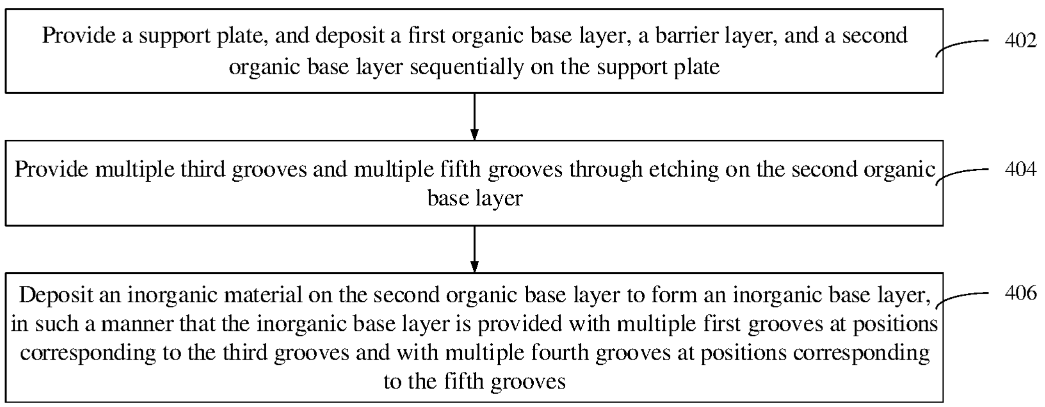
FIG. 21 is a flowchart of block 302 according to an embodiment.

In some embodiments, as illustrated in FIG. 21, block 302 includes blocks 402 to 406.

At block 402, a support plate is provided, and a first organic base layer, a barrier layer, and a second organic base layer are sequentially deposited on the support plate. Exemplarily, the first organic base layer and the second organic base layer are deposited by a polyimide coating process, and the barrier layer is formed by the CVD process. At block 404, a plurality of third grooves and a plurality of fifth grooves are provided through etching on the second organic base layer. At block 406, an inorganic material is deposited on the second organic base layer to form an inorganic base layer, in such a manner that the inorganic base layer is provided with the plurality of first grooves at positions corresponding to the third grooves and with the plurality of fourth grooves at positions corresponding to the fifth grooves.

In some embodiments, block 308 includes: a driving unit is prepared in the display area of the interlayer insulating layer, a planarization layer is formed on the interlayer insulating layer, the wiring and the driving unit, and a light-emitting unit is prepared on the planarization layer.

Exemplarily, the process of forming the driving unit may include sequentially forming an active layer, a gate insulating layer, a gate layer and a source/drain layer, and the driving unit may be formed by using conventional processes and methods in the art, and details thereof are not described herein.

Exemplarily, the process of forming the light emitting unit may include sequentially forming an anode, a hole function layer, a light emitting layer, and an electron function layer/cathode. The driving unit and light emitting unit may be formed by using conventional processes and methods in the art, and details thereof are not described herein.

In some embodiments, block 310 includes:

sequentially depositing, on the light-emitting array structure and an encapsulation area of the base plate, a first inorganic encapsulation layer, an organic encapsulation layer, and a second inorganic encapsulation layer, in such a manner that the first inorganic encapsulation layer covers the light-emitting array structure and the fourth grooves. The operations of forming the first inorganic encapsulation layer, the organic encapsulation layer and the second inorganic encapsulation layer may adopt conventional processes and methods in the art, and details thereof are not described herein.

In the method provided in the embodiments, through the provision of the first grooves and the second grooves, the effective contact area between the wiring and the interlayer insulation layer can be increased, and the surface resistance of the wiring area can be reduced. On this basis, the size of the wiring area can be reduced, and the area occupied by the wiring on the display screen is reduced. Through the provision of the fourth grooves, the encapsulation structure can more effectively prevent the internal structure of the display panel from being corroded by water and oxygen, which prolongs the service life of the display panel; and the occupied area in the horizontal plane of the non-display area that is caused by the encapsulation area can be reduced. In this way, both the wiring area and the encapsulation area are reduced, and the size of the non-display area can be effectively reduced; thus, the area actually used for display is effectively enlarged, the screen-to-body ratio of the display screen is improved, and the display effect is improved.

The present disclosure further provides an electronic device, which includes the display panel in the above embodiments or a display panel prepared by the method in the above embodiments. The electronic device provides a high screen-to-body ratio and a good display effect.

It may be noted that the division of individual units in the electronic device is only used for illustration, and in other embodiments, the electronic device may be divided into different modules as required to complete all or part of the functions of the electronic device.

The technical features of the foregoing embodiments may be combined arbitrarily, and all possible combinations of the technical features in the foregoing embodiments are not described for concise. However, as long as there is no contradiction in the combination of these technical features, it should be considered as falling within the scope described in the specification.

The foregoing embodiments only illustrate several implementations of the present disclosure, and their descriptions are relatively specific and detailed, but they should not be construed as limiting the scope of the present disclosure. It is notable for those skilled in the art that, several variations and improvements may be made by those skilled in the art without departing from the concept of the present disclosure, and all of them should fall within the protection scope of the present disclosure. Accordingly, the protection scope of the present disclosure is subject to the appended claims.

What is claimed is:

1. A display panel, comprising a display area and a non-display area, and the display panel comprising:

a base plate, wherein the base plate is provided with a plurality of first grooves, and the plurality of first grooves are located in the non-display area;

an interlayer insulating layer, wherein the interlayer insulating layer is provided on the base plate and covers the plurality of first grooves, and the interlayer insulating layer is provided with a plurality of second grooves at positions corresponding to the plurality of first grooves; and a wiring, wherein the wiring is provided on a part of the interlayer insulating layer located in the non-display area, and fills the plurality of second grooves;

wherein the base plate comprises:

a flexible substrate, wherein the flexible substrate is provided with a plurality of third grooves, and the plurality of third grooves are located in the non-display area; and an inorganic base layer provided on the flexible substrate, wherein the plurality of first grooves are provided in the inorganic base layer at positions corresponding to the plurality of third grooves.

2. The display panel of claim 1, wherein the base plate is provided with a plurality of wiring areas in the non-display area, and the plurality of first grooves are located in at least one of the plurality of wiring areas.

3. The display panel of claim 2, wherein in each of the plurality of wiring areas, at least two of the plurality of first grooves are arranged in a first direction, or at least two of the plurality of first grooves are arranged in a second direction, or at least two of the plurality of first grooves are arranged in the first direction and at least two of the plurality of first grooves are arranged in the second direction, the first direction intersecting with the second direction.

4. The display panel of claim 3, wherein the non-display area comprises a first area and a second area that are respectively provided on two opposite sides of the display area, the non-display area further comprises a third area connecting the first area and the second area, and the first direction is perpendicular to an arrangement direction along which the first area, the display area, and the second area are arranged in sequence;

in a wiring area located in the first area and a wiring area located in the second area, at least one of the first grooves extends along the first direction; and in a wiring area located in the third area, at least one of the first grooves extends in the arrangement direction.

5. The display panel of claim 3, wherein the plurality of wiring areas surround an edge of the display area, and each of the plurality of wiring areas is provided with at least one of the first grooves.

6. The display panel of claim 5, wherein the plurality of wiring areas are symmetrically distributed with respect to an axis of symmetry, and the plurality of first grooves are symmetrically arranged with respect to the axis of symmetry.

7. The display panel of claim 3, wherein each of the plurality of first grooves is selected from a strip-type groove, an annular groove or a hole-type groove.

8. The display panel of claim 7, wherein the plurality of first grooves are annular grooves surrounding the display area, and each of the plurality of first grooves is located in the plurality of the wiring areas.

9. The display panel of claim 7, wherein the strip-type groove comprises at least one of a linear strip-type groove, a curved strip-type groove, a polyline-like strip-type groove, or a tree-like strip-type groove.

10. The display panel of claim 1, wherein the flexible substrate comprises a support plate, and the flexible substrate further comprises a first organic base layer, a barrier layer and a second organic base layer sequentially provided on the support plate, wherein the plurality of third grooves are provided in the second organic base layer.

11. The display panel of claim 2, wherein the base plate further comprises an encapsulation area, the encapsulation area is located on a side of the wiring areas away from the display area, the base plate is further provided with a plurality of fourth grooves, the plurality of fourth grooves are located in the encapsulation area, and the display panel further comprises:

a light emitting array structure, wherein the light emitting array structure is provided on the interlayer insulating layer and the wiring, and the light emitting array structure is partially embedded in the interlayer insulating layer; and an encapsulation structure, wherein the encapsulation structure is provided on the light emitting array structure, and covers the light emitting array structure and the fourth grooves.

12. The display panel of claim 11, wherein there are a plurality of encapsulation areas; in each of the encapsulation areas, at least two of the plurality of fourth grooves are arranged in a third direction, or at least two of the plurality of fourth grooves are arranged in a fourth direction, or at least two of the plurality of fourth grooves are arranged in the third direction and at least of two the plurality of fourth grooves are arranged in the fourth direction, the third direction intersecting with the fourth direction.

13. The display panel of claim 11, wherein the base plate is provided with a plurality of encapsulation areas, and the fourth grooves are located in at least one of the plurality of encapsulation areas.

14. The display panel of claim 11, wherein the light emitting array structure comprises:

a planarization layer, wherein the planarization layer is provided on the interlayer insulating layer and the wiring;

a pixel defining layer, wherein the pixel defining layer is provided on the planarization layer;

a driving unit, wherein the driving unit is provided in the interlayer insulating layer and the planarization layer; and a light emitting unit, wherein the light emitting unit is provided at the pixel defining layer, and penetrates through the pixel defining layer and a part of the planarization layer, the light emitting unit is electrically connected with the driving unit, and both the light emitting unit and the driving unit are located in the display area.

15. A preparation method for a display panel, the display panel comprising a display area and a non-display area, and the method comprising:

providing a base plate, and providing a plurality of first grooves in the non-display area of the base plate;

forming an interlayer insulating layer on the base plate, in such a manner that the interlayer insulating layer covers the plurality of first grooves and a plurality of second grooves located at positions corresponding to the plurality of first grooves are obtained in the interlayer insulating layer; and forming a wiring on a part of the interlayer insulating layer located in the non-display area, wherein the wiring fills the plurality of second grooves;

wherein providing the base plate and providing the plurality of first grooves in the non-display area of the base plate, comprises:

providing a flexible substrate, and providing a plurality of third grooves in the flexible substrate at the non-display area; and providing an inorganic base layer on the flexible substrate, in such a manner that the plurality of first grooves are provided in the inorganic base layer at positions corresponding to the plurality of third grooves.

16. The method of claim 15, wherein the non-display area comprises a wiring area and an encapsulation area, the encapsulation area is located on a side of the wiring area away from the display area, the providing the plurality of first grooves in the non-display area of the base plate comprises:

providing the plurality of first grooves in the wiring area of the base plate; and the method further comprises:

providing a plurality of fourth grooves in the encapsulation area of the base plate;

after the forming of the wiring, preparing a light emitting array structure on the interlayer insulating layer and the wiring, wherein the light emitting array structure is partially embedded in the interlayer insulating layer; and depositing an encapsulation structure on the light emitting array structure and on the encapsulation area of the base plate, in such a manner that the encapsulation structure covers the light emitting array structure and the plurality of fourth grooves.

17. An electronic device, comprising a display panel having a display area and a non-display area, wherein the display panel comprises:

a base plate, wherein the base plate is provided with at least one first groove, and the at least one first groove is located in the non-display area;

an interlayer insulating layer, wherein the interlayer insulating layer is provided on the base plate and covers the at least one first groove, and the interlayer insulating layer is provided with at least one second groove at a position corresponding to the at least one first groove; and a wiring, wherein the wiring is provided on a part of the interlayer insulating layer located in the non-display area, and fills the at least one second groove;

wherein the base plate comprises a wiring area and an encapsulation area in the non-display area, the at least one first groove is provided in the wiring area, the encapsulation area is located on a side of the wiring area away from the display area, the base plate is further provided with a plurality of fourth grooves located in the encapsulation area, and the display panel further comprises:

a light emitting array structure, wherein the light emitting array structure is provided on the interlayer insulating layer and the wiring, and the light emitting array structure is partially embedded in the interlayer insulating layer; and an encapsulation structure, wherein the encapsulation structure is provided on the light emitting array structure, and covers the light emitting array structure and the plurality of fourth grooves.

18. The electronic device of claim 17, wherein the at least one first groove comprises a plurality of first grooves, and the base plate comprises:

a flexible substrate, wherein the flexible substrate is provided with a plurality of third grooves, and the plurality of third grooves are located in the non-display area; and an inorganic base layer provided on the flexible substrate, wherein the plurality of first grooves are provided in the inorganic base layer at positions corresponding to the plurality of third grooves.

19. The electronic device of claim 18, wherein the flexible substrate comprises a support plate, and the flexible substrate further comprises a first organic base layer, a barrier layer and a second organic base layer sequentially provided on the support plate, and the plurality of third grooves are provided in the second organic base layer.

20. The electronic device of claim 17, wherein there are a plurality of encapsulation areas; and in each of the encapsulation areas, at least two of the plurality of fourth grooves are arranged in a third direction, or at least two of the plurality of fourth grooves are arranged in a fourth direction, or at least two of the plurality of fourth grooves are arranged in the third direction and at least of two the plurality of fourth grooves are arranged in the fourth direction, the third direction intersecting with the fourth direction.

* * * * *